(12) United States Patent
Huang et al.

(10) Patent No.: US 12,222,380 B2
(45) Date of Patent: Feb. 11, 2025

(54) ELECTROMAGNETIC IMMUNITY TEST SYSTEM AND CONTROL METHOD THEREOF

(71) Applicants: China National Machine Tool Quality Supervision Testing Center, Beijing (CN); Shandong Jianzhu University, Jinan (CN)

(72) Inventors: Zuguang Huang, Beijing (CN); Shuai Ji, Beijing (CN); Jinjiang Wang, Beijing (CN); Ruijuan Xue, Beijing (CN); Tianliang Hu, Beijing (CN); Hepeng Ni, Beijing (CN); Chengrui Zhang, Beijing (CN)

(73) Assignees: CHINA NATIONAL MACHINE TOOL QUALITY SUPERVISION TESTING CENTER, Beijing (CN); SHANDONG JIANZHU UNIVERSITY, Jinan (CN)

( * ) Notice: Subject to any disclaimer, the term of this patent is extended or adjusted under 35 U.S.C. 154(b) by 445 days.

(21) Appl. No.: 17/857,167

(22) Filed: Jul. 4, 2022

(65) Prior Publication Data
US 2022/0334161 A1    Oct. 20, 2022

Related U.S. Application Data

(63) Continuation-in-part of application No. PCT/CN2021/112822, filed on Aug. 16, 2021.

(30) Foreign Application Priority Data

Aug. 27, 2020   (CN) .......................... 202010881277.5

(51) Int. Cl.
*G01R 29/08*     (2006.01)
*G05B 19/401*    (2006.01)

(52) U.S. Cl.
CPC ....... *G01R 29/0814* (2013.01); *G05B 19/401* (2013.01); *G05B 2219/31034* (2013.01);
(Continued)

(58) Field of Classification Search
CPC .................... G01R 31/31727; G05B 19/401
See application file for complete search history.

(56) References Cited

U.S. PATENT DOCUMENTS 4,885,519 A  * 12/1989 Vogelmann ............. H02P 21/04
                                                    318/800
5,955,618 A  *  9/1999 Kim ........................ H04N 5/08
                                                    348/495

(Continued)

*Primary Examiner* — Giovanni Astacio-Oquendo
*Assistant Examiner* — Zannatul Ferdous
(74) *Attorney, Agent, or Firm* — MATTHIAS SCHOLL P.C.; Matthias Scholl

(57) ABSTRACT

An electromagnetic immunity test system includes a data acquisition and control device, a linear module, an electromagnetic disturbance simulator, and an upper computer. The data acquisition and control device is in a data connection to the linear module, the electromagnetic disturbance simulator, and the upper computer. The linear module includes a grating ruler; and the linear module is disposed on the numerical control machine tool to measure location data of the sliding table of the numerical control machine tool and transmit the location data to the data acquisition and control device. The electromagnetic disturbance simulator is configured to generate and transmit an electromagnetic signal to the numerical control system. The data acquisition and control device is configured to read the location data in real time and transfer the real-time location data to the upper computer.

6 Claims, 2 Drawing Sheets

Figure 1:
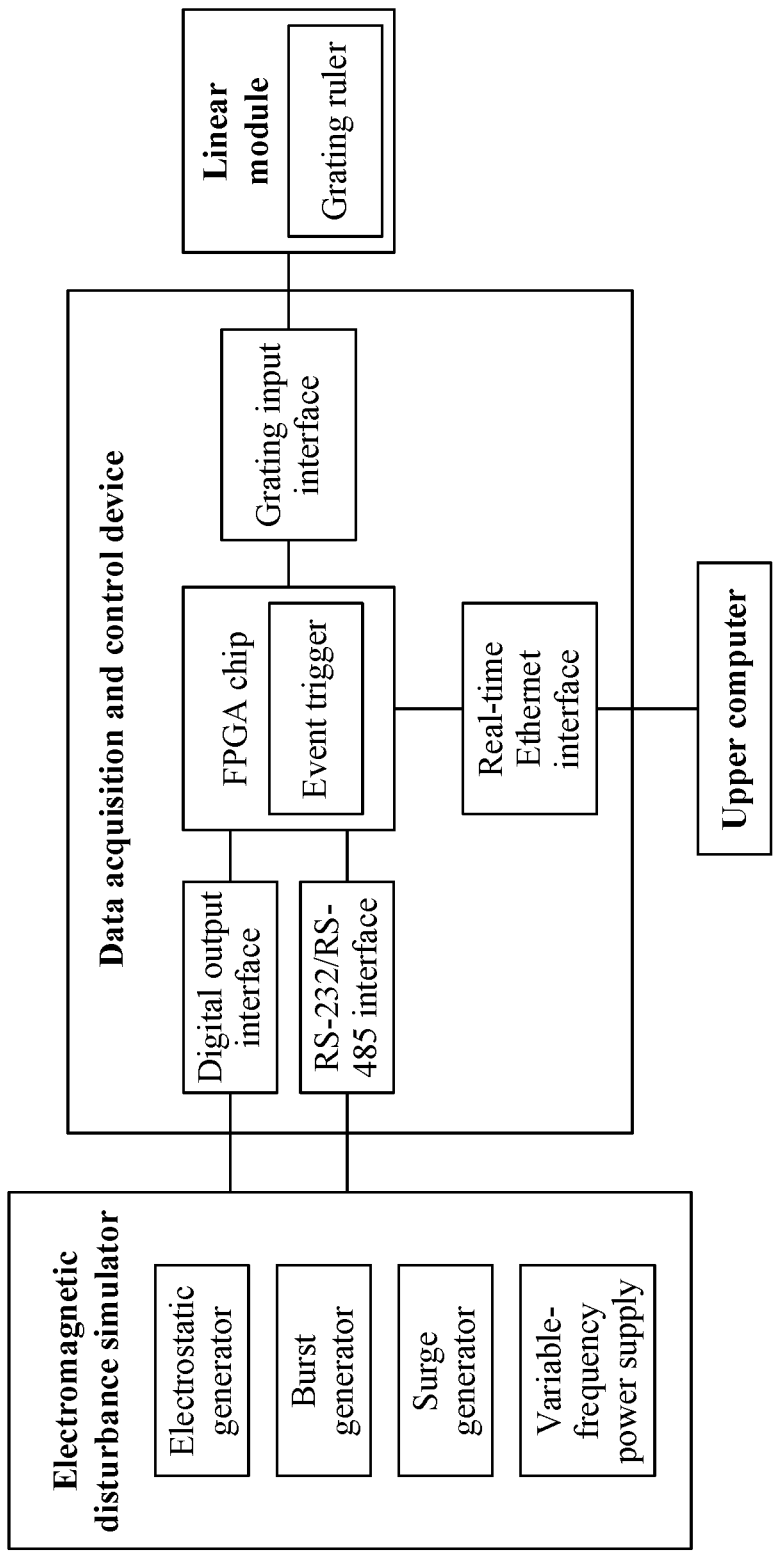

(52) U.S. Cl.
CPC .............. *G05B 2219/34024* (2013.01); *G05B 2219/34242* (2013.01); *G05B 2219/35316* (2013.01); *G05B 2219/37045* (2013.01)

(56) References Cited

U.S. PATENT DOCUMENTS

| | | | |
|---|---|---|---|
| 11,598,849 B2 * | 3/2023 | Munro | G01S 7/497 |
| 2009/0230947 A1 * | 9/2009 | Sumita | H03K 5/12 |
| | | | 327/160 |

* cited by examiner

ELECTROMAGNETIC IMMUNITY TEST SYSTEM AND CONTROL METHOD THEREOF

CROSS-REFERENCE TO RELATED APPLICATIONS

This application is a continuation-in-part of International Patent Application No. PCT/CN2021/112822 with an international filing date of Aug. 16, 2021, designating the United States, now pending, and further claims foreign priority benefits to Chinese Patent Application No. 202010881277.5 filed Aug. 27, 2020. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND

The disclosure relates to the field of numerical control testing, and more particularly, to an electromagnetic immunity test system and a control method thereof.

Numerical control system is a computer control system for automating control of the operation of the machine tools. Typically, the numerical control system includes a control program, a servo motor, and an interface circuit. The control program is stored in a memory to perform a control function.

As the numerical control system operates in a complex electromagnetic environment, its electromagnetic immunity affects the accuracy and reliability of the computer numerical control. Typically, a visual inspection method is utilized for qualitative analysis of the effect of electromagnetic disturbance on the numerical control system. However, the visual inspection method is not suitable for analysis of a high-speed, high-reliability, and a high-precision numerical control.

SUMMARY

The first objective of the disclosure is to provide an electromagnetic immunity test system for quantitative analysis of electromagnetic immunity of a numerical control system. The numerical control system comprises a numerical control machine tool comprising a sliding table.

The electromagnetic immunity test system comprises a data acquisition and control device, a linear module, an electromagnetic disturbance simulator, and an upper computer; the data acquisition and control device is in a data connection to the linear module, the electromagnetic disturbance simulator, and the upper computer. The linear module comprises a grating ruler; and the linear module is disposed on the numerical control machine tool to measure location data of the sliding table of the numerical control machine tool and transmit the location data to the data acquisition and control device.

The electromagnetic disturbance simulator is configured to generate and transmit an electromagnetic signal to the numerical control system. The data acquisition and control device is configured to read the location data in real time and transfer the real-time location data to the upper computer; according to the real-time location data and a direction of movement of the grating ruler, the data acquisition and control device controls the electromagnetic disturbance simulator to generate and transmit the electromagnetic signal to the numerical control system.

The upper computer communicates with the data acquisition and control device and is configured to receive the real-time location data, compare the data of location, speed, and acceleration of the linear module before and after being exposed to an electromagnetic disturbance, and quantitatively analyze the influence of the electromagnetic disturbance on the performance of the numerical control system through a preset test method.

In a class of this embodiment, the data acquisition and control device comprises a grating input interface, a real-time Ethernet interface, a digital output interface, and an FPGA (field-programmable gate array) chip; the FPGA chip is electrically connected to the grating input interface, the real-time Ethernet interface, and the digital output interface; the grating input interface is in a data connection to the grating ruler and the real-time Ethernet interface is in a network connection to the upper computer; the digital output interface is connected to the electromagnetic disturbance simulator and triggers the electromagnetic disturbance simulator to generate the electromagnetic disturbance to interfere in the numerical control machine tool.

In a class of this embodiment, the FPGA chip comprises an event trigger that triggers the digital output interface according to the real-time location data and the direction of the movement of the grating ruler to regulate an output level thus controlling the electromagnetic disturbance simulator to generate the electromagnetic disturbance to interfere in the numerical control machine tool.

In a class of this embodiment, the data acquisition and control device further comprises an RS-232/RS-485 interface connected to and communicating with the FPGA chip and the electromagnetic disturbance simulator, thus controlling the electromagnetic disturbance simulator to generate the electromagnetic disturbance to interfere in the numerical control machine tool.

In a class of this embodiment, the electromagnetic disturbance simulator is an electrostatic generator, a burst generator, a surge generator, a variable-frequency power supply, or a combination thereof.

The second objective of the disclosure is to provide a method of quantitative test of immunity of a numerical control system, the method comprising:
 S1. operating a numerical control machine tool to operate in a preset order; acquiring, using the data acquisition and control device, a first cycle of data measured by the grating ruler; and transferring, using the data acquisition and control device, the first cycle of data as a reference data to the upper computer;
 S2. imposing, using the electromagnetic disturbance simulator, an electromagnetic disturbance on the numerical control machine tool; acquiring, by the data acquisition and control device, a second cycle of data measured by the grating ruler; and transferring, by the data acquisition and control device, the second cycle of data as a comparison data to the upper computer; and
 S3. comparing, using the upper computer, the reference data with the comparison data; and checking, using the upper computer, whether an offset between the reference data and the comparison data is less than or equal to a given threshold; if so, the numerical control system passes the test of immunity; otherwise, the numerical control system loses the test of immunity.

Specifically, in S2:
 when the sliding table reaches a preset location in a moving direction, the event trigger triggers the digital output interface to change an output level, thus controlling the electromagnetic disturbance simulator to impose the electromagnetic disturbance on the numerical control machine tool; and the data acquisition and control device receives the second cycle of data measured by the grating ruler and transfers the second cycle of data to the upper computer.

Specifically, in S3:

the upper computer uses the reference data to draw first three curves respectively representing first location, speed, and acceleration of the sliding table, and uses the comparison data to draw second three curves respectively representing second location, speed, and acceleration of the sliding table; and the upper computer compares the first and second three curves and checks whether the offset between the reference data and the comparison data is below the given threshold; if so, the numerical control system passes the test of immunity; otherwise, the numerical control system loses the test of immunity.

The following advantages are associated with the electromagnetic immunity test system and control method thereof: during operation of the numerical control system, the linear module repeats a set of actions; the grating ruler detects real-time location of the sliding table and transfers the location data to the data acquisition and control device; the data acquisition and control device triggers the electromagnetic disturbance simulator to generate the electromagnetic disturbance to interfere in the numerical control machine tool; the upper computer compares different curves representing the location, speed and acceleration of the sliding table before and after exposure to electromagnetic disturbance, so as to estimate the electromagnetic immunity of the numerical control system; the sliding table moves at the same location, speed and acceleration before and after exposure to electromagnetic disturbance.

DETAILED DESCRIPTION OF THE DRAWINGS

Figure 2:
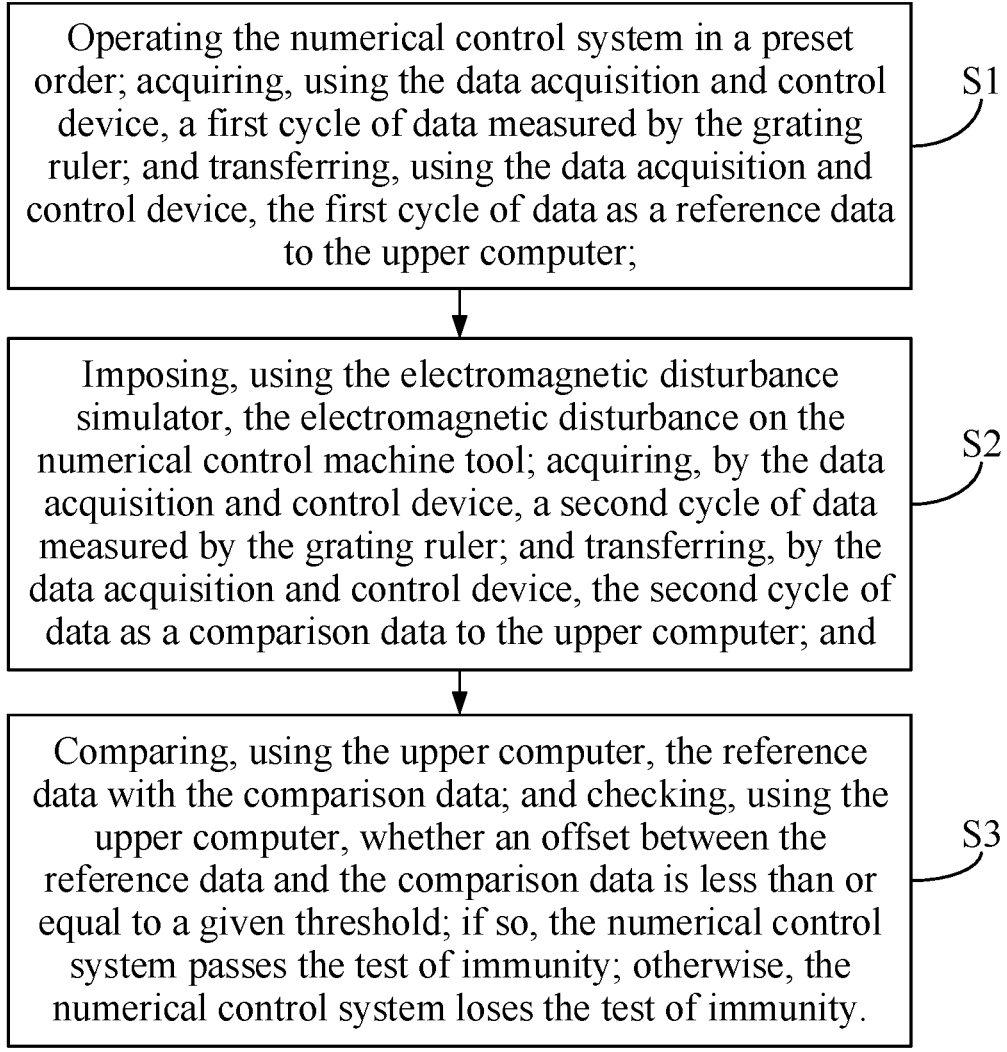

FIG. 1 is a structure diagram of an electromagnetic immunity test system according to an example of the disclosure; and FIG. 2 is a control-flow chart of an electromagnetic immunity test system according to an example of the disclosure.

DETAILED DESCRIPTION

As shown in FIG. 1, an electromagnetic immunity test system comprises a data acquisition and control device, a linear module, an electromagnetic disturbance simulator, and an upper computer; the data acquisition and control device is in a data connection to the linear module, the electromagnetic disturbance simulator, and the upper computer.

A grating ruler is disposed on the linear module; and the linear module is disposed on a numerical control machine tool to measure location data of a sliding table of the numerical control machine tool and transmit the location data to the data acquisition and control device.

The electromagnetic disturbance simulator is configured to generate and transmit an electromagnetic signal to the numerical control machine tool; the data acquisition and control device is configured to read the location data in real time and transfer the real-time location data to the upper computer; according to the real-time location data and the direction of the movement of the sliding table, the data acquisition and control device controls the electromagnetic disturbance simulator to generate and transmit the electromagnetic signal to the numerical control machine tool. The electromagnetic disturbance simulator comprises an electrostatic generator, a burst generator, a surge generator, and a variable-frequency power supply.

The data acquisition and control device comprises a grating input interface, a real-time Ethernet interface, a digital output interface, an RS-232/RS-485 interface, and an FPGA chip; the FPGA chip is electrically connected to the grating input interface, the real-time Ethernet interface, the digital output interface, and the RS-232/RS-485 interface; the digital output interface is connected to the electromagnetic disturbance simulator and triggers the electromagnetic disturbance simulator to generate the electromagnetic disturbance to interfere in the numerical control machine tool. The RS-232/RS-485 interface is in a data connection to the electromagnetic disturbance simulator, thus invoking the electromagnetic disturbance simulator to generate the electromagnetic disturbance to interfere in the numerical control machine tool.

The FPGA chip comprises an event trigger that triggers the RS-232/RS-485 interface according to the real-time location data and the direction of the movement of the sliding table, thus controlling electromagnetic disturbance simulator to generate the electromagnetic disturbance to interfere in the numerical control machine tool.

The upper computer communicates with the data acquisition and control device and is configured to receive the real-time location data, compare the data for the location, speed, and acceleration of the linear module, and measure the electromagnetic immunity of the numerical control machine tool exposed to the electromagnetic disturbance.

As shown in FIG. 2, a method of quantitative test of immunity of a numerical control system comprises:

S1. operating the numerical control system in a preset order; acquiring, using the data acquisition and control device, a first cycle of data measured by the grating ruler; and transferring, using the data acquisition and control device, the first cycle of data as a reference data to the upper computer; in S1, the grating ruler acquires data when free of the electromagnetic disturbance;

S2. imposing, using the electromagnetic disturbance simulator, an electromagnetic disturbance on the numerical control machine tool in the on state; acquiring, by the data acquisition and control device, a second cycle of data measured by the grating ruler; and transferring, by the data acquisition and control device, the second cycle of data as a comparison data to the upper computer;

in S2, the grating ruler acquires data when exposed to the electromagnetic disturbance; specifically, when the sliding table reaches a preset location in a moving direction, the event trigger triggers the digital output interface to change an output level, thus controlling the electromagnetic disturbance simulator to impose the electromagnetic disturbance on the numerical control machine tool; and the data acquisition and control device receives the second cycle of data measured by the grating ruler and transfers the second cycle of data to the upper computer; and S3. the upper computer compares the reference data with the comparison data, and check whether an offset between the reference data and the comparison data is less than or equal to a given threshold; if so, the numerical control system passes the test of immunity; otherwise, the numerical control system loses the test of immunity.

Specifically, the upper computer uses the reference data to draw first three curves respectively representing first location, speed, and acceleration of the sliding table, and uses the comparison data to draw second three curves respectively representing second location, speed, and acceleration of the sliding table; and the upper computer compares the first and second three curves and checks whether the offset between the reference data and the comparison data is below the given threshold; if so, the numerical control system passes the test of immunity; otherwise, the numerical control system loses the test of immunity.

It will be obvious to those skilled in the art that changes and modifications may be made, and therefore, the aim in the appended claims is to cover all such changes and modifications.

What is claimed is:

1. An electromagnetic immunity test system for a numerical control system, the numerical control system comprising a numerical control machine tool comprising a sliding table, and the electromagnetic immunity test system comprising:
   1) a data acquisition and control device;
   2) a linear module;
   3) an electromagnetic disturbance simulator; and
   4) an upper computer;
wherein:
   the data acquisition and control device is in a data connection to the linear module, the electromagnetic disturbance simulator, and the upper computer;
   the linear module comprises a grating ruler; and the linear module is disposed on the numerical control machine tool to measure location data of the sliding table of the numerical control machine tool and transmit the location data to the data acquisition and control device;
   the electromagnetic disturbance simulator is configured to generate and transmit an electromagnetic signal to the numerical control system;
   the data acquisition and control device is configured to read the location data in real time and transfer the real-time location data to the upper computer; according to the real-time location data and a direction of movement of the grating ruler, the data acquisition and control device controls the electromagnetic disturbance simulator to generate and transmit the electromagnetic signal to the numerical control system;
   the upper computer communicates with the data acquisition and control device and is configured to receive the real-time location data, compare data of location, speed, and acceleration of the linear module before and after being exposed to an electromagnetic disturbance, and quantitatively analyze the influence of the electromagnetic disturbance on the performance of the numerical control system through a preset test method;
   the data acquisition and control device comprises a grating input interface, a real-time Ethernet interface, a digital output interface, and a field-programmable gate array (FPGA) chip; the FPGA chip is electrically connected to the grating input interface, the real-time Ethernet interface, and the digital output interface; the grating input interface is in a data connection to the grating ruler; the real-time Ethernet interface is in a network connection to the upper computer; and the digital output interface is connected to the electromagnetic disturbance simulator and triggers the electromagnetic disturbance simulator to generate the electromagnetic disturbance to interfere in the numerical control machine tool; and
   the FPGA chip comprises an event trigger that triggers the digital output interface according to the real-time location data and the direction of the movement of the grating ruler to regulate an output level thus controlling the electromagnetic disturbance simulator to generate the electromagnetic disturbance to interfere in the numerical control machine tool.

2. The system of claim 1, wherein the data acquisition and control device further comprises an RS-232/RS-485 interface connected to and communicating with the FPGA chip and the electromagnetic disturbance simulator, thus controlling the electromagnetic disturbance simulator to generate the electromagnetic disturbance to interfere in the numerical control machine tool.

3. The system of claim 1, wherein the electromagnetic disturbance simulator is an electrostatic generator, a burst generator, a surge generator, a variable-frequency power supply, or a combination thereof.

4. A method of quantitative test of immunity of a numerical control system using the electromagnetic immunity test system of claim 1, the method comprising:
   1) operating the numerical control system in a preset order; acquiring, using the data acquisition and control device, a first cycle of data measured by the grating ruler; and transferring, using the data acquisition and control device, the first cycle of data as a reference data to the upper computer;
   2) imposing, using the electromagnetic disturbance simulator, the electromagnetic disturbance on the numerical control machine tool; acquiring, by the data acquisition and control device, a second cycle of data measured by the grating ruler; and transferring, by the data acquisition and control device, the second cycle of data as a comparison data to the upper computer; and
   3) comparing, using the upper computer, the reference data with the comparison data; and checking, using the upper computer, whether an offset between the reference data and the comparison data is less than or equal to a given threshold; if so, the numerical control system passes the test of immunity; otherwise, the numerical control system loses the test of immunity.

5. The method of claim 4, wherein 2) is carried out as follows:
   when the sliding table reaches a preset location in a moving direction, the event trigger triggers the digital output interface to change an output level, thus controlling the electromagnetic disturbance simulator to impose the electromagnetic disturbance on the numerical control machine tool; and
   the data acquisition and control device receives the second cycle of data measured by the grating ruler and transfers the second cycle of data to the upper computer.

6. The method of claim 4, wherein 3) is carried out as follows:
   the upper computer uses the reference data to draw first three curves respectively representing first location, speed, and acceleration of the sliding table, and uses the comparison data to draw second three curves respectively representing second location, speed, and acceleration of the sliding table; and the upper computer compares the first and second three curves and checks whether the offset between the reference data and the comparison data is below the given threshold; if so, the numerical control system passes the test of immunity; otherwise, the numerical control system loses the test of immunity.

\* \* \* \* \*